(12) United States Patent
Flynn et al.

(10) Patent No.: US 8,477,898 B2
(45) Date of Patent: Jul. 2, 2013

(54) HIGHLY FLEXIBLE FRACTIONAL N FREQUENCY SYNTHESIZER

(75) Inventors: James P. Flynn, Beaverton, OR (US); Richard H. Steeves, Portland, OR (US); John T. Stonick, Portland, OR (US); Daniel K. Weinlader, Allentown, PA (US); Jianping Wen, Beaverton, OR (US); Skye Wolfer, Hillsboro, OR (US); David A. Yokoyama-Martin, Portland, OR (US); Dino A. Toffolon, Stoney Creek (CA); Jasjeet Singh, Brampton (CA)

(73) Assignee: Synopsys, Inc., Mountain View, CA (US)

( * ) Notice: Subject to any disclaimer, the term of this patent is extended or adjusted under 35 U.S.C. 154(b) by 307 days.

(21) Appl. No.: 12/819,683

(22) Filed: Jun. 21, 2010

(65) Prior Publication Data
US 2011/0310942 A1 Dec. 22, 2011

(51) Int. Cl.
*H03D 3/24* (2006.01)

(52) U.S. Cl.
USPC ........... 375/376; 375/373; 375/375; 327/147; 327/149; 327/156; 327/161

(58) Field of Classification Search
USPC ............................ 375/371–376; 327/147–163
See application file for complete search history.

(56) References Cited

U.S. PATENT DOCUMENTS

| 7,899,422 | B1 * | 3/2011 | Teo et al. | 455/258 |
| 2007/0110207 | A1 * | 5/2007 | Chen et al. | 375/376 |

* cited by examiner

*Primary Examiner* — Curtis Odom
(74) *Attorney, Agent, or Firm* — Park, Vaughan, Fleming & Dowler, LLP; Fang Chen (57) ABSTRACT

One embodiment of the present invention provides a phase-locked loop (PLL) for synthesizing a fractional frequency. The PLL can include a 1/N frequency divider, a voltage-controlled oscillator (VCO), a programmable phase mixer, and a phase detector. The programmable phase mixer can be coupled between an output of the VCO and an input of the frequency divider, wherein the programmable phase mixer is configured to receive the output clock signal from the VCO and generate a first clock signal of frequency $f_1$ by varying a phase of the output clock signal. The frequency divider is configured to receive the first clock signal from the programmable phase mixer and generate a second clock signal of frequency $f_2 = f_1/N$. The phase detector can receive a reference clock signal and the second clock signal as inputs, and the phase detector's output can be used to generate the control voltage for the VCO.

18 Claims, 6 Drawing Sheets

HIGHLY FLEXIBLE FRACTIONAL N FREQUENCY SYNTHESIZER

BACKGROUND

1. Technical Field

This disclosure generally relates to frequency synthesizers. More specifically, this disclosure relates to highly flexible fractional N frequency synthesizers.

2. Related Art

Many applications in modern high-speed communication systems have a baud rate that is a non-integer multiple of the reference clock frequency. For example, in a USB 3.0-based system, the baud rate can be 5 Gbps and the reference clock frequency can be 19.2 MHz, resulting in a non-integer relationship between the baud rate and the clock frequency.

Conventional fractional N frequency synthesizers have a number of drawbacks. Some conventional synthesizers are designed to generate a specific fractional N frequency, i.e., the synthesizer is not programmable. Others are limited in the number of fractional frequencies that can be generated. In addition, because of the way they work, some fractional N frequency synthesizers introduce jitter and/or frequency spurs in the output clock signal, and/or they may change the duty cycle of the clock pulses. These drawbacks can be a serious problem because high-speed interfaces often need to operate at multiple frequencies, and communication standards often impose stringent timing requirements, such as low jitter and a 50/50 duty cycle, on their clocks.

SUMMARY

Some embodiments of the present invention provide a phase-locked loop (PLL) for synthesizing a fractional N frequency from a reference clock signal. The PLL can include a 1/N frequency divider and a voltage-controlled oscillator (VCO) to receive a control voltage and generate an output clock signal of frequency $f_{syn}$ based partly or solely on the control voltage. The PLL also includes a programmable phase mixer coupled between an output of the VCO and an input of the frequency divider, wherein the programmable phase mixer is configured to receive the output clock signal from the VCO and generate a first clock signal of frequency $f_1$ by varying a phase of the output clock signal. The frequency divider is configured to receive the first clock signal from the programmable phase mixer and generate a second clock signal of frequency $f_2 = f_1/N$. The PLL also includes a phase detector to receive the reference clock signal of frequency $f_{ref}$ and the second clock signal from the frequency divider. The phase detector produces a phase error by comparing frequency $f_{ref}$ with frequency $f_2$, wherein the phase error is used to update the control voltage so that frequency $f_2$ is synchronized with frequency $f_{ref}$. Specifically, the PLL can include a charge pump and a low-pass filter which are coupled between the phase detector and the VCO.

Note that frequency $f_{syn}$ can be different from frequency $N \times f_{ref}$. Specifically, the programmable phase mixer can be configured to compensate for the difference between frequency $f_{syn}$ and frequency $N \times f_{ref}$. In some embodiments, the difference between frequency $f_{syn}$ and frequency $N \times f_{ref}$ is less than frequency $f_{ref}$.

The PLL can include a controller coupled to the programmable phase mixer, wherein the controller sends a control signal to the programmable phase mixer to control a phase offset produced by the programmable phase mixer. The controller can be an analog or digital controller and the control signal can be an analog or digital control signal. In some embodiments, the programmable phase mixer and a digital controller are coupled through an m-bit data bus. The control resolution of the phase offset can be determined by using $f_{syn}$ and m.

The digital controller can operate at clock frequency $f_{dig}$, and the amount of phase offset that is added by the programmable phase mixer can be computed based partly or solely on frequencies $f_{syn}$, $N \times f_{ref}$, and $f_{dig}$. Specifically, the programmable phase mixer can add a phase offset to the output clock signal over a clock cycle of frequency $f_{dig}$ (i.e., the clock frequency at which the programmable phase mixer operates). The phase offset can be changed by providing appropriate control words to the programmable phase mixer.

Note that the frequency synthesizer's output is the output of the VCO, and the programmable phase mixer is located in the feedback loop of the PLL. As a result, the output of the frequency synthesizer is a clean clock signal because the jitter introduced by the programmable phase mixer is filtered by the PLL. Since the output of the frequency synthesizer is a clean clock signal, the frequency synthesizer can be used in high-speed data communication applications. For example, the output of the frequency synthesizer can be used by high-speed data communication interfaces, such as USB (Universal Serial Bus) and SATA (Serial Advanced Technology Attachment), for transmitting and/or receiving data.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Figure 1:
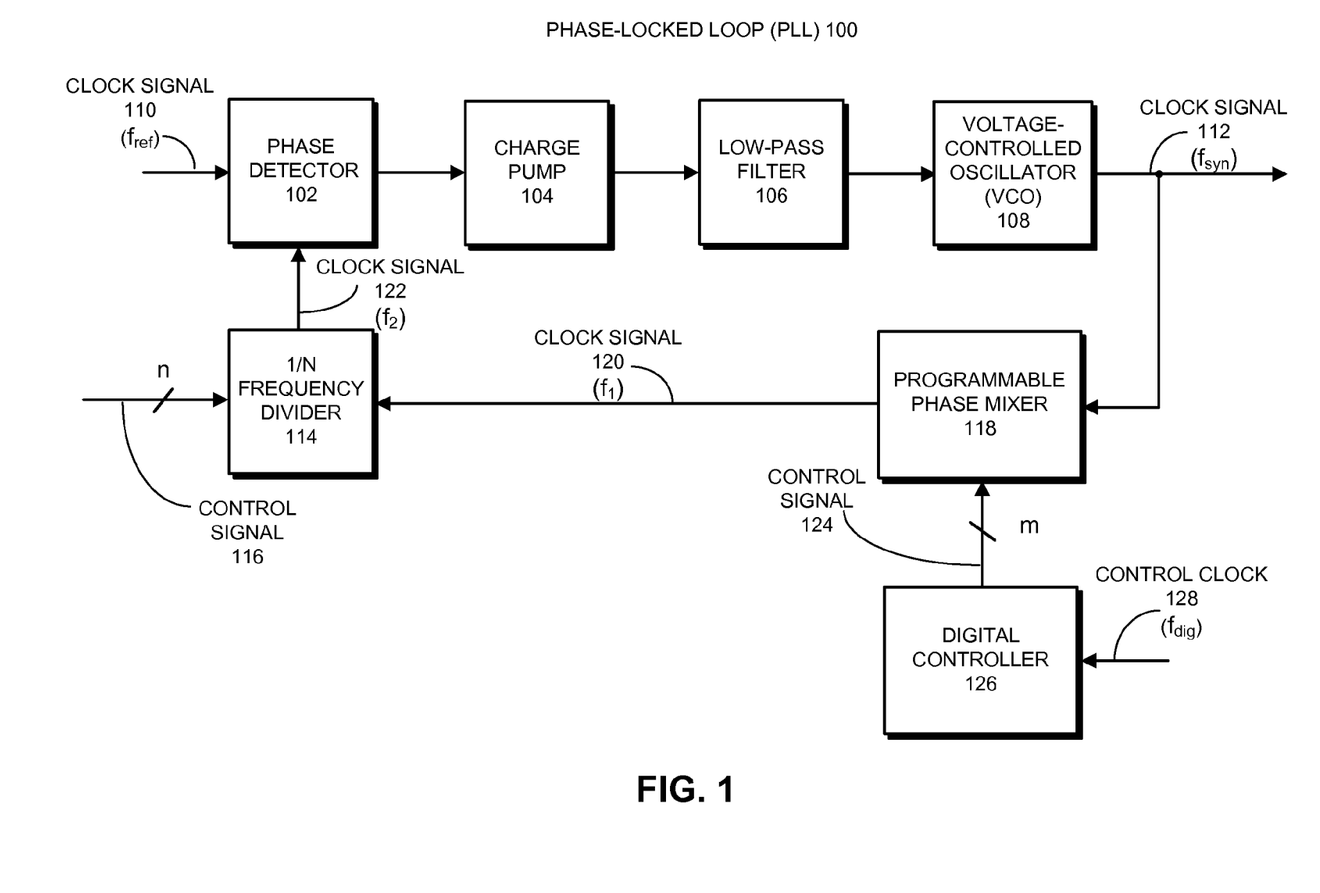
FIG. 1 illustrates a block diagram of a highly flexible fractional N frequency synthesizer in accordance with some embodiments of the present invention.

FIG. 1 illustrates a block diagram of a PLL 100 which is capable of synthesizing frequencies which are non-integer multiples of a reference clock frequency in accordance with some embodiments of the present invention. PLL 100 can include a phase detector 102, a charge pump 104, a low-pass filter 106, a voltage-controlled oscillator (VCO) 108, a programmable phase mixer 118, a digital controller 126, and a 1/N frequency divider 114. PLL 100 receives a reference clock signal (clock signal 110) of frequency $f_{ref}$ and generates a synthesized clock signal (clock signal 112) of frequency $f_{syn}$. In one embodiment, clock signal 110 is generated by a reference clock frequency generator external to PLL 100. This reference clock frequency generator can be located on the same integrated circuit (IC) chip as the PLL 100 or on a separate IC chip.

1/N frequency divider 114 is an integral frequency divider, i.e., N is an integer. 1/N frequency divider 114 is placed in the feedback path of PLL 100 between VCO 108 and a feedback input to phase detector 102. 1/N frequency divider 114 is configured to divide an input frequency of a received signal by N. In some embodiments, factor N of frequency divider 114 can be set by a control signal 116. In the example of FIG. 1, control signal 116 controls factor N through an n-bit data bus, thereby enabling 1/N frequency divider 114 to have $2^n-1$ different settings (e.g., $2^n-1$ different values of N).

PLL 100 also includes a programmable phase mixer 118 in the feedback path of PLL 100 between frequency divider 114 and VCO 108. As illustrated in FIG. 1, programmable phase mixer 118 receives synthesized clock signal 112 ($f_{syn}$) from VCO 108 and outputs a modified clock signal (clock signal 120) of frequency $f_1$ by varying the phase of clock signal 112. The phase and/or frequency of $f_1$ can be different than $f_{syn}$. A more detailed description of programmable phase mixer 118 is provided below.

Frequency divider 114 receives clock signal 120 from programmable phase mixer 118 and generates a clock signal (clock signal 122) of frequency $f_2=f_1/N$. Phase detector 102 receives reference clock signal 110 and clock signal 122 from frequency divider 114. Phase detector 102 produces a phase error by comparing frequency $f_{ref}$ with frequency $f_2$. The phase error is used to update the control voltage for VCO 108 so that clock signals 122 and 110 remain synchronized with each other. Specifically, phase detector 102, charge pump 104, low-pass filter 106, VCO 108, programmable phase mixer 118, and frequency divider 114 form a negative feedback loop.

FIG. 1 is for illustration purposes only and is not intended to limit the scope of the present invention. Specifically, the present invention can generally be used with any type of analog or digital PLLs. Further details on conventional PLL architectures can be found in a number of references, such as Ronald Best, *Phase Locked Loops: Design, Simulation, and Applications*, McGraw-Hill Professional, 6 Edition (Jul. 23, 2007), which is incorporated herein by reference.

Programmable phase mixer 118 in the feedback loop of PLL 100 receives a control signal 124 produced by a digital controller 126. In one embodiment, programmable phase mixer 118 generates clock signal 120 by varying the phase of clock signal 112 based partly or solely on control signal 124. Specifically, programmable phase mixer 118 can add a phase offset to its input clock signal 112 according to control signal 124. In some embodiments, control signal 124 is sent from digital controller 126 to programmable phase mixer 118 through an m-bit data bus. In this embodiment, the smallest phase offset that can be added to clock signal 112, i.e., the smallest control step $T_{LSB}$ of digital controller 126, can be determined by the following expression:

$$T_{LSB} = \frac{1}{f_{syn} \cdot 2^m}. \quad (1)$$

For example, if $f_{syn}$=2.5 GHz and m=10, then the smallest phase offset that can be applied to clock signal 112 is about $T_{LSB}$=0.781 ps. Digital controller 126 also receives a control clock signal (control clock 128) of frequency $f_{dig}$, which determines the operating speed of digital controller 126. In one embodiment, $f_{dig}$ also determines how often digital controller 126 changes the value of the phase offset control signal to programmable phase mixer 118.

In one embodiment, PLL 100 of FIG. 1 is used to synthesize a target frequency $f_{syn}$ which is not an exact integer multiple of the reference clock signal 110. For example, assuming a reference clock frequency $f_{ref}$=24 MHz, and a target frequency $f_{syn}$=2.5 GHz, the closest synthesized frequency that can be obtained using a frequency divider is $f_0=N \times f_{ref}$=2.496 GHz, where N=104. Note that the difference between $f_{syn}$ and $f_0$ is less than $f_{ref}$, or a fraction of $f_{ref}$. In one embodiment, programmable phase mixer 118 can be used to compensate for this fractional difference between $f_{syn}$ and $f_0$. In this embodiment, control signal 116 and frequency divider 114 are used to generate a frequency that is close to the desired frequency, and the remaining discrepancy is compensated for using programmable phase mixer 118 and digital controller 126.

Figure 2:
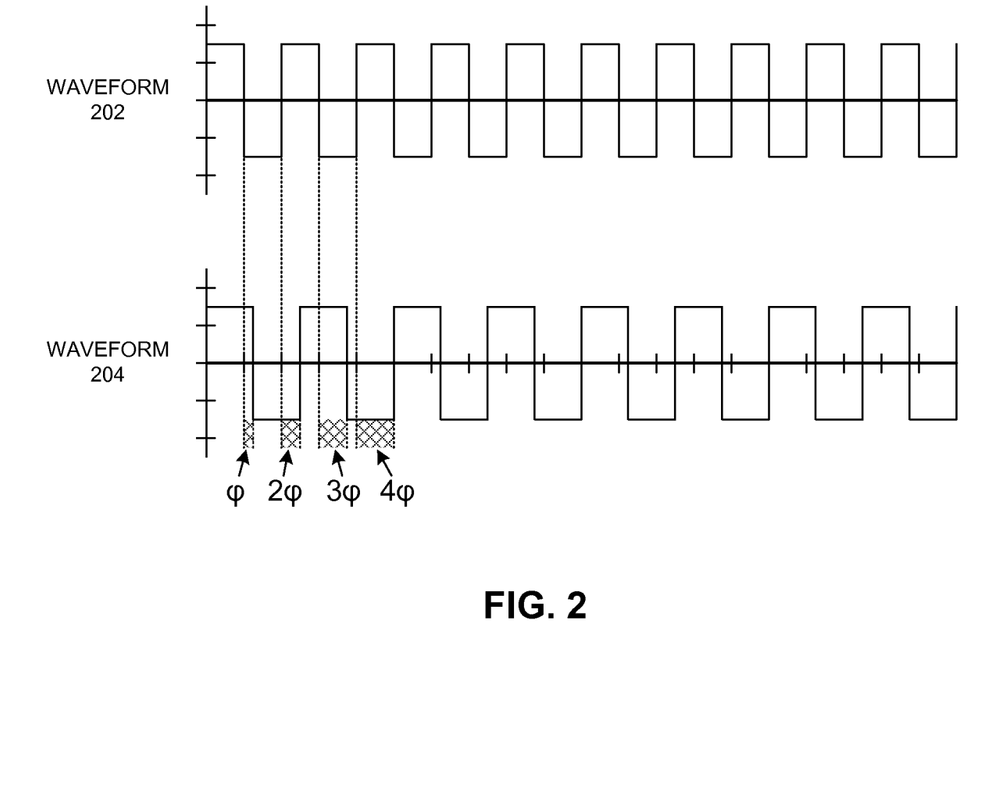
FIG. 2 illustrates input and output waveforms for a programmable phase mixer in accordance with some embodiments of the present invention.

FIG. 2 illustrates input and output waveforms for a programmable phase mixer in accordance with some embodiments of the present invention.

A programmable phase mixer can apply a programmable amount of phase delay to an input signal to produce an output signal that has a different phase and/or frequency. For example, waveform 202 illustrates an idealized input signal (e.g., an idealized version of clock signal 112) of a programmable phase mixer, and waveform 204 illustrates an idealized output signal (e.g., an idealized version of clock signal 120) of a programmable phase mixer. Control signal 124 may be implemented using various techniques. In some embodiments, floor and ceiling values may feed an accumulator which then drives the phase mixer. In these embodiments, the control signal 124 can provide phase changes relative to the phase value that is currently stored in the accumulator.

As shown in FIG. 2, a programmable phase mixer can increase the phase delay by $\phi$ at each clock edge of waveform 202 to produce waveform 204. Waveform 204 is a periodic signal that has a different period and thus a different frequency than waveform 202. Note that, due to the fact that the operation of adding phase is mathematically a periodic function, the phase mixer can add additional phase to its output indefinitely. In some embodiments, the phase mixer may add an aggregate phase delay after a certain number of clock edges in waveform 202. For example, instead of increasing the phase delay by $\phi$ at each clock edge of waveform 202, the programmable phase mixer may increase the phase delay by $2\phi$ at every other clock edge of waveform 202. In this manner, programmable phase mixer 118 can generate an output clock signal that has a different frequency from the input clock signal. FIG. 2 has been presented for illustration purposes only and is not intended to limit the present invention. In general, a programmable phase mixer can be any circuit that can modify the phase of an input signal to produce an output signal whose phase and/or frequency is different from the input signal.

The update rate r of programmable phase mixer 118 can be determined by the following expression:

$$r = \frac{f_{syn}}{f_{dig}}. \quad (2)$$

In other words, a phase update takes place after every r clock cycles of $f_{syn}$. For example, if $f_{dig}$=250 MHz, and $f_{syn}$=2.5 GHz, then r=10, i.e., the phase offset can be updated every 10 clock cycles. The aggregate phase offset $T_{offset}$ that needs to be added over the r clock cycles is given by:

$$T_{offset} = r \cdot \left( \frac{1}{f_0} - \frac{1}{f_{syn}} \right), \quad (3)$$

wherein $f_0 = N \times f_{ref}$. Using the above exemplary values of r, N, $f_{ref}$ and $f_{syn}$, we obtain $T_{offset} = 6.41$ ps. In other words, the phase mixer needs to add an aggregate phase delay of 6.41 ps every 10 clock cycles. Note that $T_{offset}$ represents the change in the phase delay that is currently being added by the phase mixer. For example, if the phase mixer is currently adding a phase delay $T_D$, then $T_{offset}$ represents the change in the $T_D$ value.

Next, phase offset $T_{offset}$ can be converted to a digital value of control signal 124 based on the smallest control step $T_{LSB}$ of digital controller 126:

$$\delta = \frac{T_{offset}}{T_{LSB}}, \quad (4)$$

wherein $\delta$ is the number of $T_{LSB}$ needed for generating $T_{offset}$. Again using the above exemplary values for $T_{offset}$ and $T_{LSB}$, we get $\delta = 8.205$.

In some embodiments, the phase mixer is programmed to add an aggregate phase delay of floor($\delta$)$\times T_{LSB}$ for a certain period of time and then to add an aggregate phase delay of ceiling($\delta$)$\times T_{LSB}$ for a certain period of time. Specifically, the residue $\tau$ (also referred to as a "fractional remainder") can be expressed as:

$$\tau = \delta - \text{floor}(\delta). \quad (5)$$

In one embodiment, digital controller 126 can compensate for the fractional remainder by using a control value of floor($\delta$) in the 1st to (k−1)th clock cycle of control clock 128 and using a control value of ceiling($\delta$) at the kth clock cycle of control clock 128. The value of k can be computed as follows:

$$k = \text{ceiling}\left( \frac{1}{\tau} \right). \quad (6)$$

Updating the phase in this manner causes the average phase offset to be substantially equal to $\delta$.

The above phase updating scheme has been presented for illustration purposes only and is not intended to limit the scope of the present invention. Many modifications and variations will be apparent to one skilled in the art. For example, in another embodiment, a control value of ceiling($\delta$) can be used for j clock cycles, and then a control value of floor($\delta$) can be used to compensate for the fractional reminder $\tau$=ceiling($\delta$)−$\delta$ at every jth clock cycle, where j can be computed by:

$$j = \text{ceiling}\left( \frac{1}{\tau} \right). \quad (7)$$

Even if the phase is updated as explained above, we may still be left with a second order residue. In some embodiments, the phase updating scheme can be extended to compensate for the second order residue.

Figure 3:
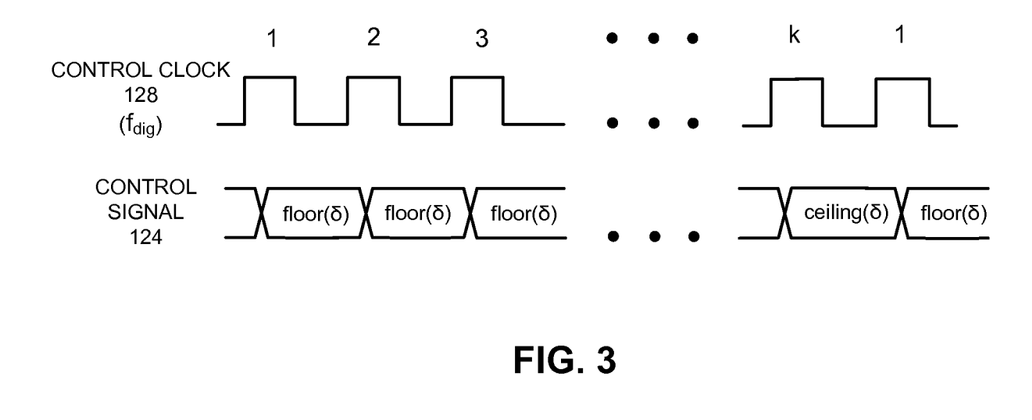
FIG. 3 illustrates how the control value for the programmable phase mixer can be updated in accordance with some embodiments of the present invention.

FIG. 3 presents a timing diagram illustrating control signal 124 and control clock 128 during the phase update operation on programmable phase mixer 118 in accordance with some embodiments of the present invention. As illustrated in FIG. 3, for the first (k−1) clock cycles of control clock 128, a phase offset value of floor($\delta$) can be provided to programmable phase mixer 118, which causes programmable phase mixer 118 to add a phase offset floor($\delta$)$\times T_{LSB}$ to input clock signal 112 over r clock cycles. At the kth clock cycle of control clock 128, a phase offset value of ceiling($\delta$) can be provided to programmable phase mixer 118, which causes programmable phase mixer 118 to add a phase offset ceiling($\delta$)$\times T_{LSB}$ to input clock signal 112 over r clock cycles to compensate for the residue error. Note that control signal 124 may be implemented in various forms. As an example, the floor and ceiling values may feed an accumulator which then drives the phase mixer. This exemplary embodiment uses a phase mixer that operates based on the relative phase change between consecutive values.

Figure 4:
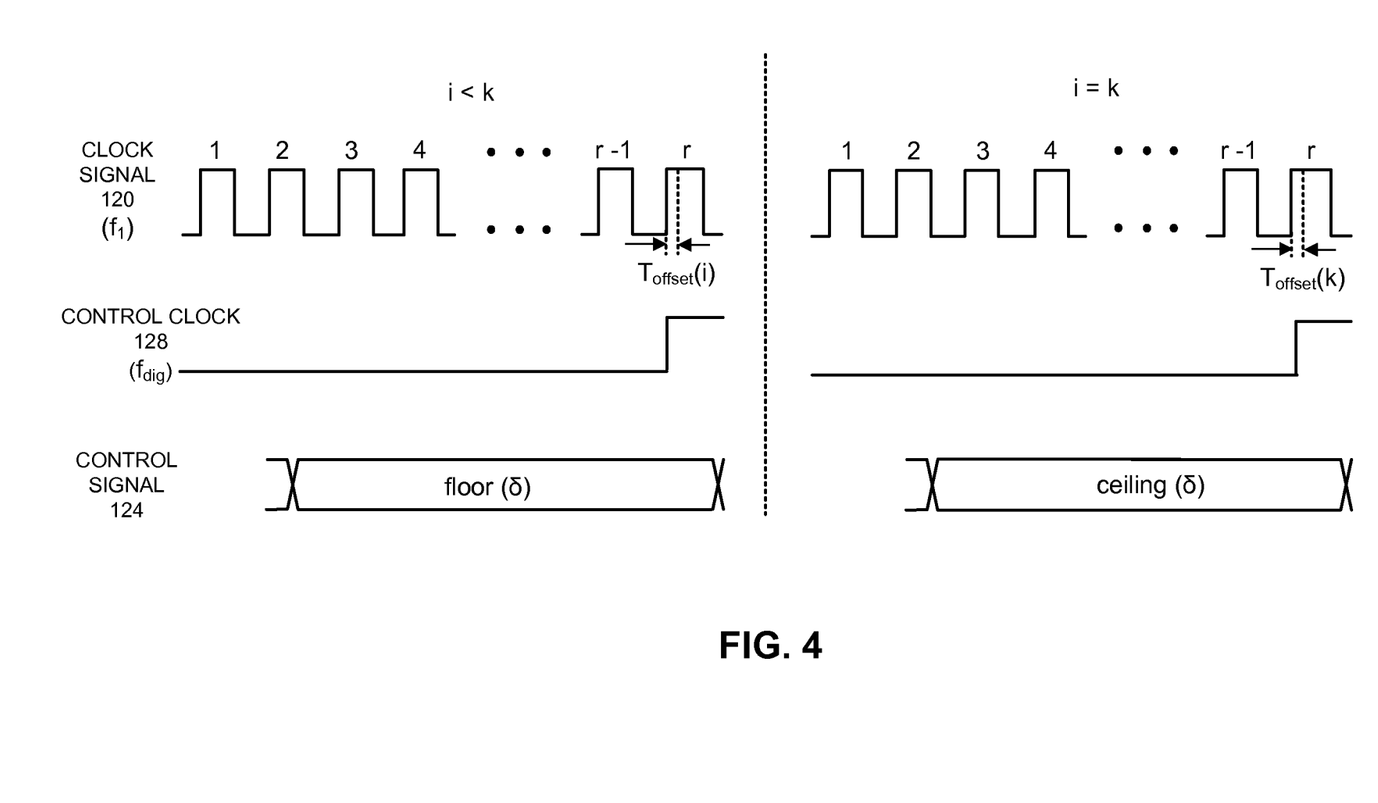
FIG. 4 illustrates how the programmable phase mixer can add an aggregate phase delay in accordance with some embodiments of the present invention.

FIG. 4 presents a timing diagram illustrating exemplary phase relationships between clock signal 120, control clock 128, and control signal 124 during the phase update operation on programmable phase mixer 118 in accordance with some embodiments of the present invention. As shown in FIG. 4, each cycle of control clock 128 encompasses r cycles of clock signal 120 (because $r = f_{syn}/f_{dig}$). As explained above, a control value of floor($\delta$) or ceiling($\delta$) is provided to programmable phase mixer 118. Specifically, in clock cycle i of control signal 124, where i<k, a control value of floor($\delta$) is provided to programmable phase mixer 118. This can cause programmable phase mixer 118 to add an aggregate phase offset $T_{offset}(i)$ to every $r^{th}$ clock cycle of clock signal 120. In the $k^{th}$ clock cycle of control signal 124, a control value of ceiling($\delta$) is provided to programmable phase mixer 118. This can cause programmable phase mixer 118 to add an aggregate phase offset $T_{offset}(k)$ to every $r^{th}$ clock cycle of clock signal 120. FIG. 4 has been presented for illustration purposes only and is not intended to limit the scope of the present invention. Specifically, in some embodiments, programmable phase mixer 118 can spread out the aggregate phase offset $T_{offset}(k)$ across the r clock cycles of clock signal 120 instead of adding the entire phase offset to the $r^{th}$ clock cycle.

Figure 5:
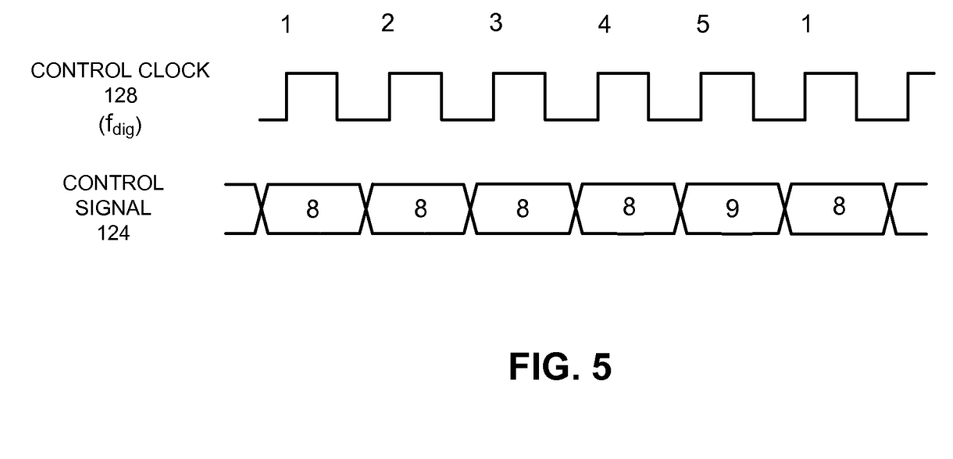
FIG. 5 illustrates the control signal that is provided to the programmable phase mixer in accordance with some embodiments of the present invention.

Using the above numerical example, the fractional reminder is $\tau = 0.205$, floor($\delta$)=8, ceiling($\delta$)=9, and k=5. FIG. 5 presents a timing diagram illustrating control signal 124 and control clock 128 during the phase update operation based on the above numerical values in accordance with some embodiments of the present invention. As illustrated in FIG. 5, control signal 124 encodes a control value of 8 for four clock cycles followed by a control value of 9 in the $5^{th}$ clock cycle of control clock 128.

The frequency $f_1$ of clock signal 120 produced by programmable phase mixer 118 can be expressed as follows:

$$f_1 = \frac{k \cdot r}{(r-1) \cdot k \cdot \left( \frac{1}{f_{syn}} \right) + (k-1)\left( \frac{1}{f_{syn}} + \text{floor}(\delta) \cdot T_{LSB} \right) + \left( \frac{1}{f_{syn}} + \text{ceiling}(\delta) \cdot T_{LSB} \right)}. \quad (8)$$

When programmable phase mixer 118 introduces phase offsets to the feedback clock signal 112, the phase mixer can include additional frequency components in clock signal 120. However, because programmable phase mixer 118 is embedded in the feedback loop of PLL 100, which has a low-pass response, the additional frequency components in clock signal 120 are substantially filtered out. As a result, the output of PLL 100 has low jitter, a 50/50 duty cycle, and a minimal amount of frequency spurs, as required by most high-speed data communication standards.

Figure 6:
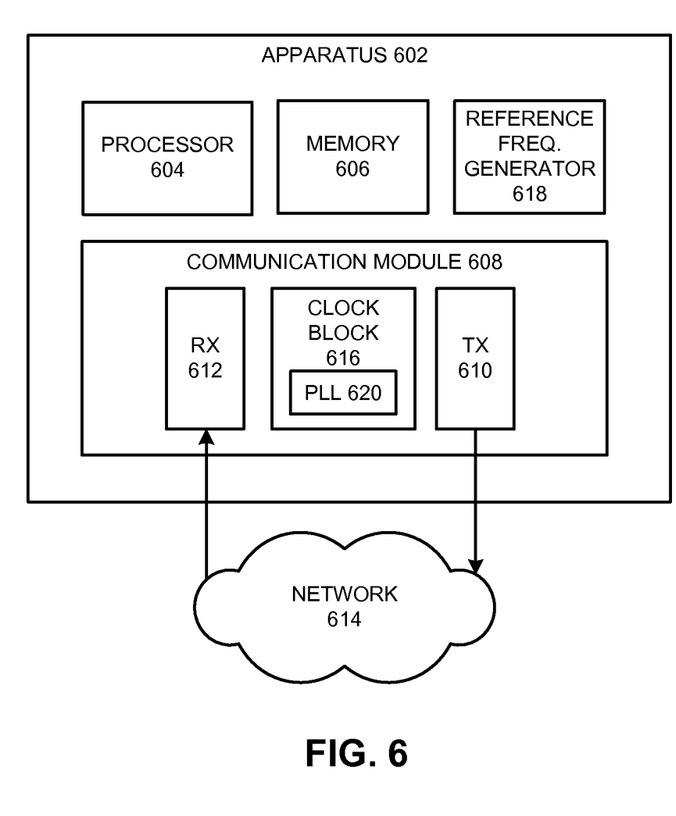
FIG. 6 illustrates an apparatus in accordance with some embodiments of the present invention.

FIG. 6 illustrates an apparatus in accordance with some embodiments of the present invention.

Apparatus 602 can comprise a plurality of mechanisms which may communicate with one another via a wired or wireless communication channel. Apparatus 602 may be realized using one or more integrated circuits, and apparatus 602 may include fewer or more mechanisms than those shown in FIG. 6. Further, apparatus 602 may be integrated in a computer system, or it may be realized as a separate device which is capable of communicating with other computer systems and/or devices. Specifically, apparatus 602 can comprise a processor 604, a memory device 606, a reference frequency generator 618, and a communication module 608 which may be coupled to network 614.

During operation, processor 604 may be configured to read instructions and/or data from memory device 606, and process the instructions and/or data to produce a result. Further, processor 604 can use communication module 608 to communicate data via a transmitter 610, and to receive data via a receiver 612.

Transmitter 610 and/or receiver 612 can include one or more PLL modules for synthesizing a fractional frequency from a reference clock generated by reference frequency generator 618. In some embodiments, communication module 608 may include clock block 616 which may include circuitry for PLL 620. The clock signal generated by clock block 616 may be supplied to transmitter 610 and receiver 612. In some embodiments, communication module 608 is a high-speed data communication interface, e.g., a USB or a SATA interface. Specifically, the clock signal generated by clock block 616 (e.g., output clock signal 112 of VCO 108 shown in FIG. 1) can be used by transmitter 610 and/or receiver 612 to transmit and receive data, respectively.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A phase-locked loop (PLL), comprising:
a 1/N frequency divider, wherein N is an integer;
a voltage-controlled oscillator (VCO) configured to receive a control voltage and generate an output clock signal of frequency $f_{syn}$ based partly or solely on the control voltage;
a programmable phase mixer coupled between an output of the VCO and an input of the 1/N frequency divider, wherein the programmable phase mixer is configured to receive the output clock signal from the VCO and generate a first clock signal of frequency $f_1$ by varying a phase difference between the output clock signal and the first clock signal;
wherein the 1/N frequency divider is configured to receive the first clock signal from the programmable phase mixer and generate a second clock signal of frequency $f_2 = f_1/N$;
a phase detector configured to receive a reference clock signal of frequency $f_{ref}$ and the second clock signal from the 1/N frequency divider, and produce a phase error by comparing frequency $f_{ref}$ with frequency $f_2$, wherein the phase error is used to update the control voltage so that frequency $f_2$ is synchronized to frequency $f_{ref}$; and
a controller coupled to the programmable phase mixer, wherein the controller sends a control signal to the programmable phase mixer to control a phase offset produced by the programmable phase mixer;
wherein the controller receives a control clock signal of frequency $f_{dig}$, and wherein the phase offset is computed by evaluating an expression that comprises $f_{syn}$, N, $f_{ref}$, and $f_{dig}$.

2. The PLL of claim 1, wherein frequency $f_{syn}$ is different from frequency $N \times f_{ref}$, and wherein the programmable phase mixer is configured to compensate for the difference between frequency $f_{syn}$ and frequency $N \times f_{ref}$.

3. The PLL of claim 2, wherein the difference between frequency $f_{syn}$ and frequency $N \times f_{ref}$ is less than frequency $f_{ref}$.

4. The PLL of claim 1, wherein the programmable phase mixer is configured to add a phase offset to the programmable phase mixer's output on each clock cycle of the control clock signal.

5. The PLL of claim 1, wherein the programmable phase mixer is configured to add a first phase offset to the output clock signal at every 1st to kth clock cycles of the output clock signal, and a second phase offset to the output clock signal at every (k+1)th clock cycle of the control clock signal.

6. The PLL of claim 1, wherein the programmable phase mixer is configured to add a phase offset into the output clock signal at every rth clock cycle of the output clock signal, wherein $r = f_{syn}/f_{dig}$.

7. The PLL of claim 1, wherein the PLL is an analog PLL.

8. The PLL of claim 1, wherein the programmable phase mixer is located in a feedback loop of the PLL, which filters jitter from the output clock signal.

9. The PLL of claim 1, further comprising a charge pump and a low-pass filter which are coupled between the phase detector and the VCO.

10. The PLL of claim 1, wherein the output clock signal of the VCO is used by a high-speed data communication interface to transmit or receive data.

11. A communication system, comprising:
a reference frequency generator which generates a reference clock signal of frequency $f_{ref}$; and
a clock block which includes a PLL for synthesizing a fractional frequency based on the reference clock signal, wherein the PLL further comprises:
a 1/N frequency divider, wherein N is an integer;
a voltage-controlled oscillator (VCO) configured to receive a control voltage and generate an output clock signal of frequency $f_{syn}$ based partly or solely on the control voltage;
a programmable phase mixer coupled between an output of the VCO and an input of the 1/N frequency divider, wherein the programmable phase mixer is configured to receive the output clock signal from the VCO and generate a first clock signal of frequency $f_1$ by varying a phase difference between the output clock signal and the first clock signal;
wherein the 1/N frequency divider is configured to receive the first clock signal from the programmable phase mixer and generate a second clock signal of frequency $f_2=f_1/N$;
a phase detector configured to receive the reference clock signal from the reference clock frequency generator and the second clock signal from the 1/N frequency divider, and produce a phase error by comparing frequency $f_{ref}$ with frequency $f_2$, wherein the phase error is used to update the control voltage so that frequency $f_2$ is synchronized to frequency $f_{ref}$; and
a controller coupled to the programmable phase mixer, wherein the controller sends a control signal to the programmable phase mixer to control a phase offset produced by the programmable phase mixer;
wherein the controller receives a control clock signal of frequency $f_{dig}$, and wherein the phase offset is computed by evaluating an expression that comprises $f_{syn}$, N, $f_{ref}$, and $f_{dig}$.

12. The communication system of claim 11, wherein frequency $f_{syn}$ is different from frequency $N \times f_{ref}$ and wherein the programmable phase mixer is configured to compensate for the difference between frequency $f_{syn}$ and frequency $N \times f_{ref}$.

13. The communication system of claim 12, wherein the difference between frequency $f_{syn}$, and frequency $N \times f_{ref}$ is less than frequency $f_{ref}$.

14. The communication system of claim 11, wherein the output clock signal of the VCO is used by the communication system to transmit or receive data.

15. An apparatus, comprising:
a processor;
a memory; and
a communication module including a PLL, wherein the PLL comprises:
a 1/N frequency divider, wherein N is an integer;
a voltage-controlled oscillator (VCO) configured to receive a control voltage and generate an output clock signal of frequency $f_{syn}$ based partly or solely on the control voltage;
a programmable phase mixer coupled between an output of the VCO and an input of the 1/N frequency divider, wherein the programmable phase mixer is configured to receive the output clock signal from the VCO and generate a first clock signal of frequency $f_1$ by varying a phase difference between the output clock signal and the first clock signal;
wherein the 1/N frequency divider is configured to receive the first clock signal from the programmable phase mixer and generate a second clock signal of frequency $f_2=f_1/N$;
a phase detector configured to receive a reference clock signal of frequency $f_{ref}$ and the second clock signal from the 1/N frequency divider, and produce a phase error by comparing frequency $f_{ref}$ with frequency $f_2$, wherein the phase error is subsequently used to update the control voltage so that $f_2$ is synchronized to frequency $f_{ref}$; and
a controller coupled to the programmable phase mixer, wherein the controller sends a control signal to the programmable phase mixer to control a phase offset produced by the programmable phase mixer;
wherein the controller receives a control clock signal of frequency $f_{dig}$, and wherein the phase offset is computed by evaluating an expression that comprises $f_{syn}$, N, $f_{ref}$, and $f_{dig}$.

16. The apparatus of claim 15, wherein frequency $f_{syn}$ is different from frequency $N \times f_{ref}$ and wherein the programmable phase mixer is configured to compensate for the difference between frequency $f_{syn}$ and frequency $N \times f_{ref}$.

17. The apparatus of claim 16, wherein the difference between frequency $f_{syn}$ and frequency $N \times f_{ref}$ is less than frequency $f_{ref}$.

18. The apparatus of claim 15, wherein the output clock signal of the VCO is used by the communication module to transmit or receive data.

* * * * *